United States Patent
Pagaila et al.

(10) Patent No.: US 8,962,393 B2
(45) Date of Patent: Feb. 24, 2015

(54) INTEGRATED CIRCUIT PACKAGING SYSTEM WITH HEAT SHIELD AND METHOD OF MANUFACTURE THEREOF

(75) Inventors: Reza Argenty Pagaila, Singapore (SG); Byung Tai Do, Singapore (SG); Linda Pei Ee Chua, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 6 days.

(21) Appl. No.: 13/244,273

(22) Filed: Sep. 23, 2011
(Under 37 CFR 1.47)

(65) Prior Publication Data
US 2013/0075889 A1    Mar. 28, 2013

(51) Int. Cl.
| | | |
|---|---|---|
| H01L 21/00 | (2006.01) | |
| H01L 23/552 | (2006.01) | |
| H01L 23/00 | (2006.01) | |
| H01L 23/433 | (2006.01) | |
| H01L 25/10 | (2006.01) | |
| H01L 23/31 | (2006.01) | |
| H01L 23/498 | (2006.01) | |
| H01L 21/56 | (2006.01) | |

(52) U.S. Cl.
CPC .............. *H01L 23/552* (2013.01); *H01L 24/97* (2013.01); *H01L 23/4334* (2013.01); *H01L 25/105* (2013.01); *H01L 2224/32225* (2013.01); *H01L 2224/48227* (2013.01); *H01L 2224/73265* (2013.01); *H01L 2225/1023* (2013.01); *H01L 2225/1041* (2013.01); *H01L 2225/1094* (2013.01); *H01L 2924/15311* (2013.01); *H01L 2924/19107* (2013.01); *H01L 23/3128* (2013.01); *H01L 23/49816* (2013.01); *H01L 21/561* (2013.01); *H01L 2924/1815* (2013.01); *H01L 2924/3511* (2013.01); *H01L 2224/97* (2013.01); *H01L 2924/3025* (2013.01)
USPC ............ 438/122; 438/127; 257/706; 257/716

(58) Field of Classification Search
USPC .......................... 438/122, 127; 257/706, 713
See application file for complete search history.

(56) References Cited

U.S. PATENT DOCUMENTS

| | | | |
|---|---|---|---|
| 7,169,642 B2 | 1/2007 | Karnezos | |
| 7,683,469 B2 * | 3/2010 | Oh et al. | 257/686 |
| 7,968,979 B2 | 6/2011 | Pagaila et al. | |
| 2008/0067672 A1 * | 3/2008 | Katoh et al. | 257/712 |
| 2008/0122067 A1 * | 5/2008 | Wang | 257/706 |
| 2009/0321898 A1 * | 12/2009 | Pagaila et al. | 257/660 |

\* cited by examiner

*Primary Examiner* — Zandra Smith
*Assistant Examiner* — Jamie C Niesz
(74) *Attorney, Agent, or Firm* — Ishimaru & Associates LLP

(57) ABSTRACT

A method of manufacture of an integrated circuit packaging system includes: mounting a device mounting structure over a bottom substrate; mounting a heat spreader having an opening formed by a single integral structure with a dam and a flange, the dam having a dam height greater than a flange height of the flange; and forming a package encapsulation over the device mounting structure and the bottom substrate with the device mounting structure exposed within the opening.

20 Claims, 7 Drawing Sheets

INTEGRATED CIRCUIT PACKAGING SYSTEM WITH HEAT SHIELD AND METHOD OF MANUFACTURE THEREOF

TECHNICAL FIELD

The present invention relates generally to an integrated circuit packaging system, and more particularly to a system for heat dissipation.

BACKGROUND ART

The rapidly growing market for portable electronics devices, e.g. cellular phones, laptop computers, and personal digital assistants (PDAs), is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems can be more intelligent, have higher density, use less power, operate at higher speed, and can include mixed technology devices and assembly structures at lower cost than today.

There have been many approaches to addressing the advanced packaging requirements of microprocessors and portable electronics with successive generations of semiconductors. Many industry road maps have identified significant die periphery between the current semiconductor capability and the available supporting electronic packaging technologies. The limitations and issues with current technologies include increasing clock rates, electromagnetic interference (EMI) radiation, thermal loads, second level assembly reliability stresses and cost.

As these packaging systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: mounting a device mounting structure over a bottom substrate; mounting a heat spreader having an opening formed by a single integral structure with a dam and a flange, the dam having a dam height greater than a flange height of the flange; and forming a package encapsulation over the device mounting structure and the bottom substrate with the device mounting structure exposed within the opening.

The present invention provides an integrated circuit packaging system, including: a device mounting structure over a bottom substrate; a heat spreader having an opening formed by a single integral structure with a dam and a flange, the dam having a dam height greater than a flange height of the flange; and a package encapsulation over the device mounting structure and the bottom substrate with the device mounting structure exposed within the opening.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
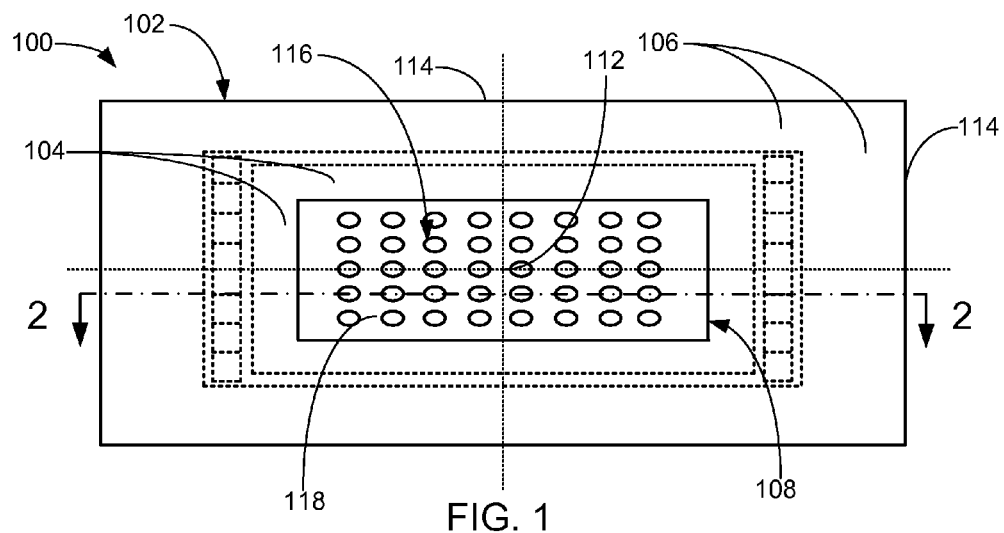
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the active side of the integrated circuit, regardless of its orientation. The term "vertical" refers to a direction perpendicular to the horizontal as just defined. Terms, such as "above", "below", "bottom", "top", "side", "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The dotted lines provide illustrations of the elements of the present invention, but are not actually shown from the top view. The integrated circuit packaging system 100 can include a heat spreader 102, which is defined as a conductive structure that transfers heat and electricity generated within the integrated circuit packaging system 100 to the external environment. The term "external" refers to outside the integrated circuit packaging system 100. For example, the heat spreader 102 can be a heat shield or an electromagnetic interference (EMI) shield.

The heat spreader 102 can be a single integral structure having a dam 104 and a flange 106 that bounds an opening 108 of the heat spreader 102. The dam 104 is defined as a portion of the heat spreader 102 that forms a boundary of the opening 108. The flange 106 is defined as a portion of the heat spreader 102 extending from the dam 104. An opening center 112 is defined as the centrally located with equal distance from a perimeter edge 114 of the heat spreader 102.

A device mounting structure 116 can be exposed within the opening 108. The device mounting structure 116 is defined as an electrical interface routing structure. For example, the device mounting structure 116 can include an interposer, a laminated substrate, or a ceramic substrate. The device mounting structure 116 can include a connection side 118, which is defined as the side of the device mounting structure 116 for connecting signals to the next system level. For example, the connection side 118 can be exposed within the opening 108 of the heat spreader 102.

It has been discovered that having the heat spreader 102 with the opening 108 having the opening center 112 allows the opportunity to stack another device (not shown) on the integrated circuit packaging system 100. The ability to stack another device in the opening 108 can reduce the profile of the various semiconductor devices, such as Fan-in Package on package (Fi-PoP), thus, lowering the production cost.

It has also been discovered that having the heat spreader 102 with the opening 108 allows evenly spaced dissipation of heat from the center or interior of the integrated circuit packaging system 100 and another device stacked on the integrated circuit packaging system 100. As a result, the heat spreader 102 improves the thermal performance of the integrated circuit packaging system 100. Improving the thermal performance of the integrated circuits increases board level reliability and performance of the semiconductor device. The thermally-enhanced package design of the present invention can be applied to various semiconductor devices, thus, lowering the production cost.

Figure 2:
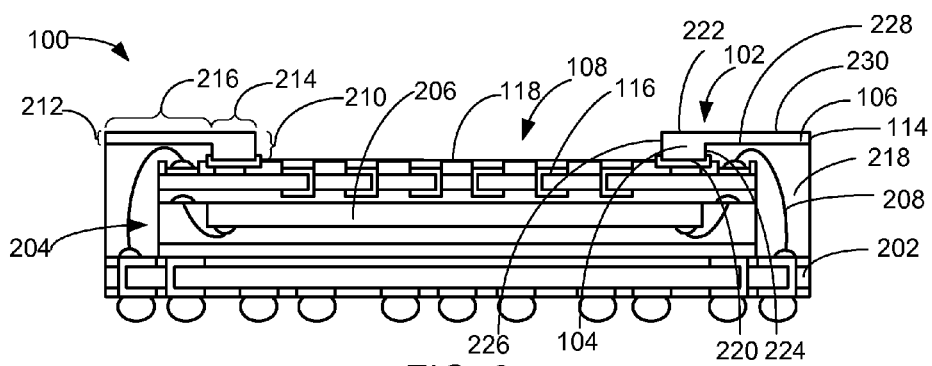
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 can include a bottom substrate 202 with an inner package 204, having an inner integrated circuit 206, on the bottom substrate 202.

The bottom substrate 202 is defined as a mounting structure for an integrated circuit or other electrical components as well as providing electrical connections between, to, and from the devices mounted thereto. The inner integrated circuit 206 is defined as chip with active circuitry fabricated thereon. For example, the inner integrated circuit 206 can include a flip chip, a wire bonded chip, or a packaged integrated circuit. The inner integrated circuit 206 can be mounted over the bottom substrate 202.

The inner package 204 is defined as a packaged integrated circuit that can be mounted on other package or structures, or receive other packages. For example, the inner package 204 can include the inner integrated circuit 206 representing a wire bond chip or a flip chip or a flip chip. The inner package 204 can include the device mounting structure 116 over the inner integrated circuit 206.

The integrated circuit packaging system 100 can include a peripheral electrical interconnect 208, which is defined as a connection interface for electrical connection to other components. For example, the peripheral electrical interconnect 208 can include a bondwire, conductive columns, solder balls, or conductive interconnects. For this example, the peripheral electrical interconnect 208 can represent a bondwire for z-interconnect between the bottom substrate 202 and the device mounting structure 116.

The integrated circuit packaging system 100 can include the heat spreader 102, the heat spreader 102 having the opening 108 formed by a single integral structure with the dam 104 and the flange 106, the dam 104 having a dam height 210 greater than a flange height 212 of the flange 106. For example, the dam height 210 can be greater than twice of the flange height 212.

The dam height 210 can represent the non-horizontal distance between a dam bottom side 220 and a dam topside 222.

The flange height 212 can represent the non-horizontal distance between a flange bottom side 228 and a flange topside 230.

It has been discovered that the heat spreader 102 can provide electromagnetic isolation between the integrated circuit packaging system 100 and another device (not shown) stacked on the integrated circuit packaging system 100. The dam height 210 being greater than the flange height 212 allows additional space for the peripheral electrical interconnect 208 to be mounted on the bottom substrate 202 and under the flange 106. As a result, the heat spreader 102 can provide electromagnetic isolation between the integrated circuit packaging system 100 and another device stacked on the device mounting structure 116, thus improving board level reliability and performance of the semiconductor device.

For another example, the integrated circuit packaging system 100 can include the heat spreader 102 having the opening 108 bounded by the dam 104, the dam 104 having a dam width 214 less than a flange width 216. The flange width 216 can be greater than twice of the dam width 214.

The flange width 216 can represent the non-vertical distance between a dam outer side 224 and the perimeter edge 114. The dam outer side 224 is defined as the side of the dam 104 facing away from the opening 108. The dam width 214 can represent the non-vertical distance between the dam outer side 224 and a dam inner side 226, which is defined as the side of the dam 104 facing the opening 108. A top planar portion of the heat spreader 102 can represent the total non-vertical distance combining the dam width 214 and the flange width 216.

The integrated circuit packaging system 100 can include a package encapsulation 218. The package encapsulation 218 is defined as a cover surrounding and protecting the contents in the integrated circuit packaging system 100 from the environment and hermetically seals the contents internal to the integrated circuit packaging system 100. For example, the package encapsulation 218 can be formed under the flange 106 and in contact with the dam 104 only on the dam outer side 224. Also for example, the package encapsulation 218 can be formed in contact with the flange bottom side 228. A side of the package encapsulation 218 can be formed coplanar with the perimeter edge 114, for example.

It has been discovered that the dam 104 can prevent mold flash, bleed contamination, or a combination thereof on a connection pad exposed on the connection side 118 of the device mounting structure 116. As a result, exposure of the connection side 118 without the risk of mold flash, bleed contamination, or a combination thereof allows the stacking of another device. As a result, the thermally-enhanced package design of the present invention can be applied to various semiconductor devices, thus, lowering the production cost.

It has been also discovered that the ability of the heat spreader 102 to act as dam material can allow the conventional molding method without a dedicated mold chase. As a result, the cost of a dedicated mold chase can be eliminated, thus, reducing fabrication cost.

It has been further discovered that the dam 104 can act as a stiffener to minimize warpage on the inner package 204 or the device mounting structure 116. The minimization of warpage improves the structural reliability of the integrated circuit packaging system 100. Additionally, the improvement of the structural reliability increases board level reliability and performance of the semiconductor device. Therefore, the thermally-enhanced package design of the present invention can be applied to various semiconductor devices, thus, lowering the production cost.

Figure 3:
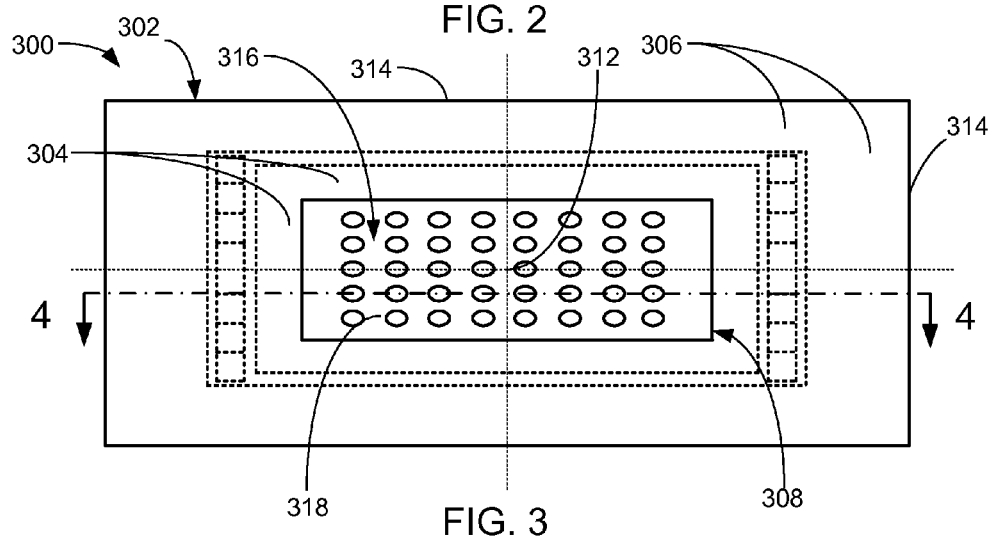
FIG. 3 is a top view of an integrated circuit packaging system in a second embodiment of the present invention.

Referring now to FIG. 3, therein is shown a top view of an integrated circuit packaging system 300 in a second embodiment of the present invention. The dotted lines provide illustrations of the elements of the present invention, but are not actually shown from the top view. The integrated circuit packaging system 300 can include a heat spreader 302, which is defined as a conductive structure that transfers heat and electricity generated within the integrated circuit packaging system 300 to the external environment. The term "external" refers to outside the integrated circuit packaging system 300. For example, the heat spreader 302 can be a heat shield or an electromagnetic interference (EMI) shield.

The heat spreader 302 can be a single integral structure having a dam 304 and a flange 306 that bounds an opening 308 of the heat spreader 302. The dam 304 is defined as a portion of the heat spreader 302 that forms a boundary of the opening 308. The flange 306 is defined as a portion of the heat spreader 302 extending from the dam 304. An opening center 312 is defined as the centrally located with equal distance from a perimeter edge 314 of the heat spreader 302.

A device mounting structure 316 can be exposed within the opening 308. The device mounting structure 316 is defined as an electrical interface routing structure. For example, the device mounting structure 316 can include an interposer, a laminated substrate, or a ceramic substrate. The device mounting structure 316 can include a connection side 318, which is defined as the side of the device mounting structure 316 for connecting signals to the next system level. For example, the connection side 318 can be exposed within the opening 308 of the heat spreader 302.

It has been discovered that having the heat spreader 302 with the opening 308 having the opening center 312 allows the opportunity to stack another device (not shown) on the integrated circuit packaging system 300. The ability to stack another device in the opening 308 can reduce the profile of the various semiconductor devices, such as Fan-in Package on package (Fi-PoP), thus, lowering the production cost.

It has also been discovered that having the heat spreader 302 with the opening 308 allows evenly spaced dissipation of heat from the center or interior of the integrated circuit packaging system 300 and another device stacked on the integrated circuit packaging system 300. As a result, the heat spreader 302 improves the thermal performance of the integrated circuit packaging system 300. Improving the thermal performance of the integrated circuits increases board level reliability and performance of the semiconductor device. The thermally-enhanced package design of the present invention can be applied to various semiconductor devices, thus, lowering the production cost.

Figure 4:
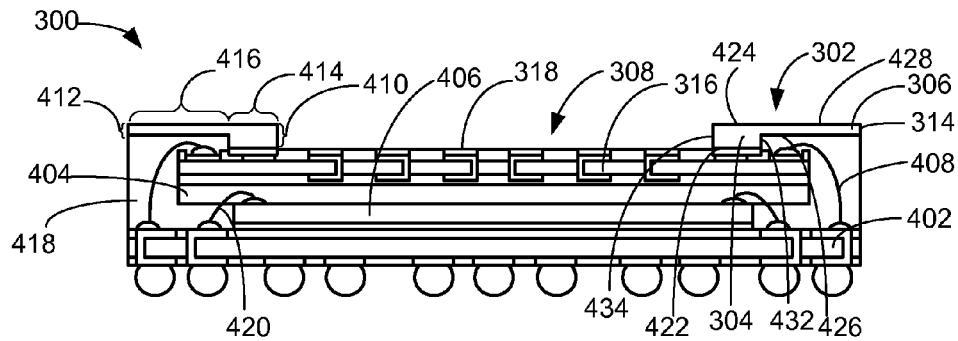
FIG. 4 is a cross-sectional view of the integrated circuit packaging system along the line 4-4 of FIG. 3.

Referring now to FIG. 4, therein is shown a cross-sectional view of the integrated circuit packaging system 300 along the line 4-4 of FIG. 3. The integrated circuit packaging system 300 can include a bottom substrate 402 with an inner integrated circuit 406 over the bottom substrate 402.

The bottom substrate 402 is defined as a mounting structure for an integrated circuit or other electrical components as well as providing electrical connections between, to, and from the devices mounted thereto. The inner integrated circuit 406 is defined as chip with active circuitry fabricated thereon. For example, the inner integrated circuit 406 can include a flip chip, a wire bonded chip, or a packaged integrated circuit.

The integrated circuit packaging system 300 can include a wire-in-film adhesive 404 on an active side of the inner integrated circuit 406. The wire-in-film adhesive 404 is defined as a sticky material for holding components in place having an inner electrical interconnect 420 in the sticky material. The inner electrical interconnect 420 is defined as a connection interface for electrical connection to other components. For example, the inner electrical interconnect 420 can include a bondwire, conductive columns, solder balls, or conductive interconnects. The inner electrical interconnect 420 can provide electrical connection between the bottom substrate 402 and the inner integrated circuit 406.

The wire-in-film adhesive 404 can be mounted on the inner integrated circuit 406 and over the bottom substrate 402. The device mounting structure 316 can be mounted on the wire-in-film adhesive 404.

The integrated circuit packaging system 300 can include a peripheral electrical interconnect 408, which is defined as a connection interface for electrical connection to other components. For example, the peripheral electrical interconnect 408 can include a bondwire, conductive columns, solder balls, or conductive interconnects. For this example, the peripheral electrical interconnect 408 can represent a bondwire for z-interconnect between the bottom substrate 402 and the device mounting structure 316.

The integrated circuit packaging system 300 can include the heat spreader 302, the heat spreader 302 having the opening 308 formed by a single integral structure with the dam 304 and the flange 306, the dam 304 having a dam height 410 greater than a flange height 412 of the flange 306. For example, the dam height 410 can be greater than twice of the flange height 412.

The dam height 410 can represent the non-horizontal distance between a dam bottom side 422 and a dam topside 424. The flange height 412 can represent the non-horizontal distance between a flange bottom side 426 and a flange topside 428.

It has been discovered that the heat spreader 302 can provide electromagnetic isolation between the integrated circuit packaging system 300 and another device (not shown) stacked on the integrated circuit packaging system 300. The dam height 410 being greater than the flange height 412 allows additional space for the peripheral electrical interconnect 408 to be mounted on the bottom substrate 402 and under the flange 306. As a result, the heat spreader 302 can provide electromagnetic isolation between the integrated circuit packaging system 300 and another device stacked on the device mounting structure 316, thus improving board level reliability and performance of the semiconductor device.

For another example, the integrated circuit packaging system 300 can include the heat spreader 302 having the opening 308 bounded by the dam 304, the dam 304 having a dam width 414 less than a flange width 416. The flange width 416 can be greater than twice of the dam width 414.

The flange width 416 can represent the non-vertical distance between a dam outer side 432 and the perimeter edge 314. The dam outer side 432 is defined as the side of the dam 304 facing away from the opening 308. The dam width 414 can represent the non-vertical distance between the dam outer side 432 and a dam inner side 434, which is defined as the side of the dam 304 facing the opening 308. A top planar portion of the heat spreader 302 can represent the total non-vertical distance combining the dam width 414 and the flange width 416.

The integrated circuit packaging system 300 can include a package encapsulation 418. The package encapsulation 418 is defined as a cover surrounding and protecting the contents in the integrated circuit packaging system 300 from the environment and hermetically seals the contents internal to the integrated circuit packaging system 300. For example, the package encapsulation 418 can be formed under the flange 306.

It has been discovered that the dam 304 can prevent mold flash, bleed contamination, or a combination thereof on a connection pad exposed on the connection side 318 of the device mounting structure 316. As a result, exposure of the connection side 318 without the risk of mold flash, bleed contamination, or a combination thereof allows the stacking of another device. As a result, the thermally-enhanced package design of the present invention can be applied to various semiconductor devices, thus, lowering the production cost.

It has been also discovered that the ability of the heat spreader 302 to act as dam material can allow the conventional molding method without a dedicated mold chase. As a result, the cost of a dedicated mold chase can be eliminated, thus, reducing fabrication cost.

It has been further discovered that the dam 304 can act as a stiffener to minimize warpage on the inner integrated circuit 406 or the device mounting structure 316. The minimization of warpage improves the structural reliability of the integrated circuit packaging system 300. Additionally, the improvement of the structural reliability increases board level reliability and performance of the semiconductor device. Therefore, the thermally-enhanced package design of the present invention can be applied to various semiconductor devices, thus, lowering the production cost.

Figure 5:
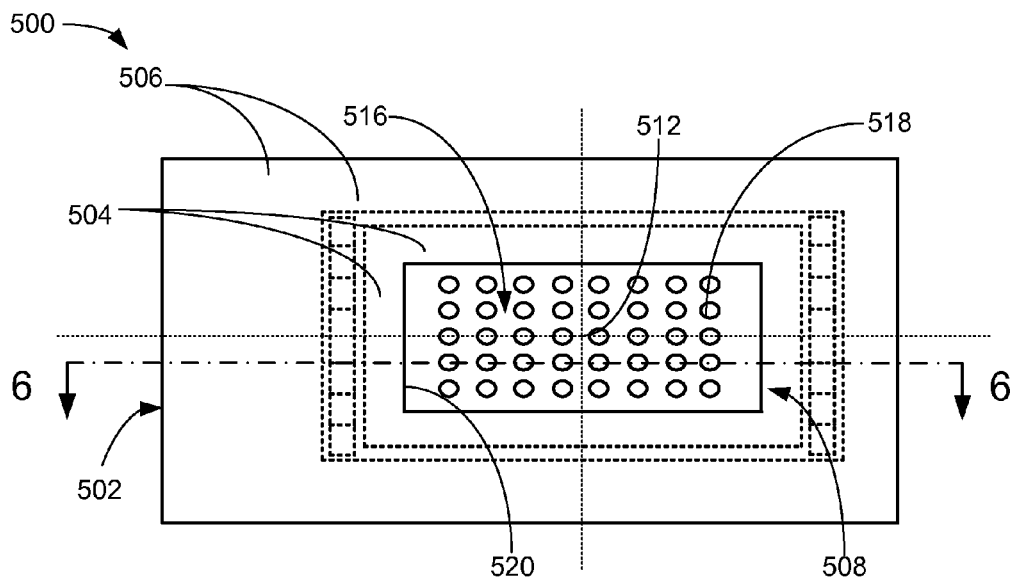
FIG. 5 is a top view of an integrated circuit packaging system in a third embodiment of the present invention.

Referring now to FIG. 5, therein is shown a top view of an integrated circuit packaging system 500 in a third embodiment of the present invention. The dotted lines provide illustrations of the elements of the present invention, but are not actually shown from the top view. The integrated circuit packaging system 500 can include a heat spreader 502, which is defined as a conductive structure that transfers heat and electricity generated within the integrated circuit packaging system 500 to the external environment. The term "external" refers to outside the integrated circuit packaging system 500. For example, the heat spreader 502 can be a heat shield or an electromagnetic interference (EMI) shield.

The heat spreader 502 can be a single integral structure having a dam 504 and a flange 506 that bounds an opening 508 of the heat spreader 502. The dam 504 is defined as a portion of the heat spreader 502 that forms a boundary of the opening 508. The flange 506 is defined as a portion of the heat spreader 502 extending from the dam 504. An opening center 512 is defined as the centrally located with equal distance from a dam inner side 520 facing the opening 508 that bounds the opening 508. The dam inner side 520 is defined as the side of the dam 504 facing the opening 508.

A device mounting structure 516 can be exposed within the opening 508. The device mounting structure 516 is defined as an electrical interface routing structure. For example, the device mounting structure 516 can include an interposer, a laminated substrate, or a ceramic substrate. The device mounting structure 516 can include a connection side 518, which is defined as the side of the device mounting structure 516 for connecting signals to the next system level. For example, the connection side 518 can be exposed within the opening 508 of the heat spreader 502.

It has been discovered that having the heat spreader 502 with the opening 508 having the opening center 512 allows the opportunity to stack another device (not shown) on the integrated circuit packaging system 500. The ability to stack another device in the opening 508 can reduce the profile of the various semiconductor devices, such as Fan-in Package on package (Fi-PoP), thus, lowering the production cost.

It has also been discovered that having the heat spreader 502 with the opening 508 allows evenly spaced dissipation of heat from the center or interior of the integrated circuit packaging system 500 and another device stacked on the integrated circuit packaging system 500. As a result, the heat spreader 502 improves the thermal performance of the integrated circuit packaging system 500. Improving the thermal performance of the integrated circuits increases board level reliability and performance of the semiconductor device. The thermally-enhanced package design of the present invention can be applied to various semiconductor devices, thus, lowering the production cost.

Figure 6:
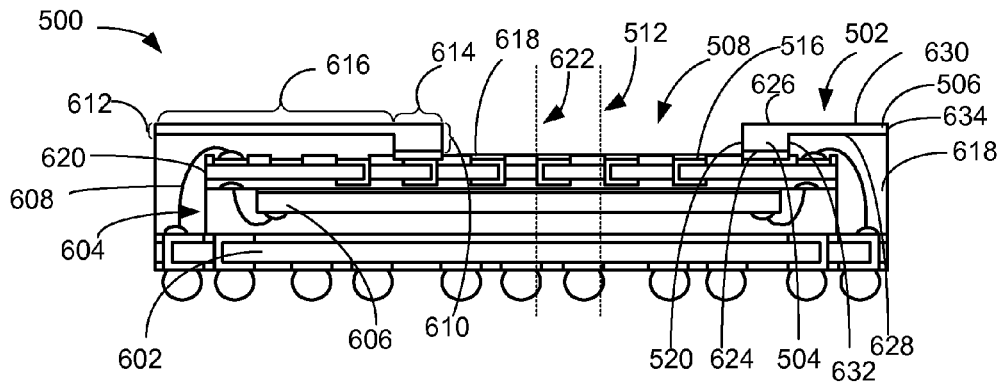
FIG. 6 is a cross-sectional view of the integrated circuit packaging system along the line 6-6 of FIG. 5.

Referring now to FIG. 6, therein is shown a cross-sectional view of the integrated circuit packaging system 500 along the line 6-6 of FIG. 5. The integrated circuit packaging system 500 can include a bottom substrate 602 with an inner package 604, having an inner integrated circuit 606, on the bottom substrate 602.

The bottom substrate 602 is defined as a mounting structure for an integrated circuit or other electrical components as well as providing electrical connections between, to, and from the devices mounted thereto. The inner integrated circuit 606 is defined as chip with active circuitry fabricated thereon. For example, the inner integrated circuit 606 can include a flip chip, a wire bonded chip, or a packaged integrated circuit. The inner integrated circuit 606 can be mounted over the bottom substrate 602.

The inner package 604 is defined as a packaged integrated circuit that can be mounted on other package or structures, or receive other packages. For example, the inner package 604 can include the inner integrated circuit 606 representing a wire bond chip or a flip chip. The inner package 604 can include the device mounting structure 516.

The device mounting structure 516 can include a peripheral edge 620, which is defined as the side of the device mounting structure 516 that forms the borderline of the device mounting structure 516. Furthermore, the device mounting structure 516 can include an device mounting structure center 622, which is defined as the centrally located with equal distance from the peripheral edge 620 of the device mounting structure 516.

The integrated circuit packaging system 500 can include a peripheral electrical interconnect 608, which is defined as a connection interface for electrical connection to other components. For example, the peripheral electrical interconnect 608 can include a bondwire, conductive columns, solder balls, or conductive interconnects. For this example, the peripheral electrical interconnect 608 can represent a bondwire for z-interconnect between the bottom substrate 602 and the device mounting structure 516.

The integrated circuit packaging system 500 can include the heat spreader 502, the heat spreader 502 having the opening 508 formed by a single integral structure with the dam 504 and the flange 506, the dam 504 having a dam height 610 greater than a flange height 612 of the flange 506. For example, the dam height 610 can be greater than twice of the flange height 612.

The dam height 610 can represent the non-horizontal distance between a dam bottom side 624 and a dam topside 626. The flange height 612 can represent the non-horizontal distance between a flange bottom side 628 and a flange topside 630.

It has been discovered that the heat spreader 502 can provide electromagnetic isolation between the integrated circuit packaging system 500 and another device (not shown) stacked on the integrated circuit packaging system 500. The dam height 610 being greater than the flange height 612 allows additional space for the peripheral electrical interconnect 608 to be mounted on the bottom substrate 602 and under the flange 506. As a result, the heat spreader 502 can provide electromagnetic isolation between the integrated circuit packaging system 500 and another device stacked on the device mounting structure 516, thus improving board level reliability and performance of the semiconductor device.

For another example, the integrated circuit packaging system 500 can include the heat spreader 502 having the opening 508 bounded by the dam 504, the dam 504 having a dam width 614 less than a flange width 616. The flange width 616 can be greater than twice of the dam width 614.

The flange width 616 can represent the non-vertical distance between a dam outer side 632 and a heat spreader edge 634. The dam outer side 632 is defined as the side of the dam 504 facing away from the opening 508. The dam width 614 can represent the non-vertical distance between the dam outer side 632 and the dam inner side 520. A top planar portion of the heat spreader 502 can represent the total non-vertical distance combining the dam width 614 and the flange width 616.

The heat spreader 502 can include the opening with the opening center 512 offset from the device mounting structure center 622 relative to the peripheral edge 620. For example, the opening center 512 can be offset to be closer to one side of the peripheral edge 620 than another side of the peripheral edge 620.

The integrated circuit packaging system 500 can include a package encapsulation 618. The package encapsulation 618 is defined as a cover surrounding and protecting the contents in the integrated circuit packaging system 500 from the environment and hermetically seals the contents internal to the integrated circuit packaging system 500. For example, the package encapsulation 618 can be formed under the flange 506.

It has been discovered that the dam 504 can prevent mold flash, bleed contamination, or a combination thereof on a connection pad exposed on the connection side 518 of the device mounting structure 516. As a result, exposure of the connection side 518 without the risk of mold flash, bleed contamination, or a combination thereof allows the stacking of another device. As a result, the thermally-enhanced package design of the present invention can be applied to various semiconductor devices, thus, lowering the production cost.

It has been also discovered that the ability of the heat spreader 502 to act as dam material can allow the conventional molding method without a dedicated mold chase. As a result, the cost of a dedicated mold chase can be eliminated, thus, reducing fabrication cost.

It has been further discovered that the dam 504 can act as a stiffener to minimize warpage on the inner package 604 or the device mounting structure 516. The minimization of warpage improves the structural reliability of the integrated circuit packaging system 500. Additionally, the improvement of the structural reliability increases board level reliability and performance of the semiconductor device. Therefore, the thermally-enhanced package design of the present invention can be applied to various semiconductor devices, thus, lowering the production cost.

Figure 7:
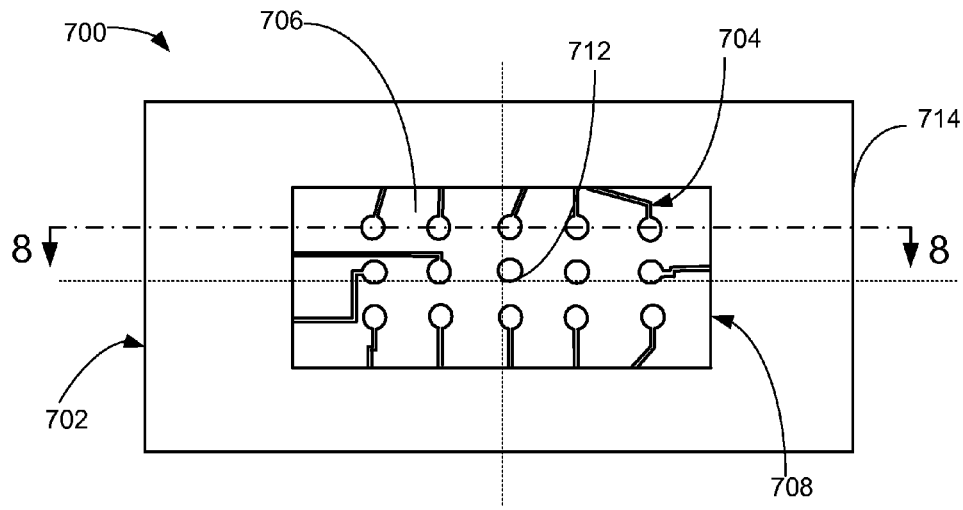
FIG. 7 is a top view of an integrated circuit packaging system in a fourth embodiment of the present invention.

Referring now to FIG. 7, therein is shown a top view of an integrated circuit packaging system 700 in a fourth embodiment of the present invention. The dotted lines provide illustrations of the elements of the present invention, but are not actually shown from the top view. The integrated circuit packaging system 700 can include a heat spreader 702, which is defined as a conductive structure that transfers heat and electricity generated within the integrated circuit packaging system 700 to the external environment. The term "external" refers to outside the integrated circuit packaging system 700. For example, the heat spreader 702 can be a heat shield or an electromagnetic interference (EMI) shield.

The heat spreader 702 can have an opening 708 bounded by the heat spreader 702. An opening center 712 is defined as the centrally located with equal distance from a perimeter edge 714 of the heat spreader 702.

The integrated circuit packaging system 700 can include a device mounting structure 706, which is defined as an electrical interface routing structure. The device mounting structure 706 can include an integrated circuit die, which is defined as chip with active circuitry fabricated thereon. For example, the integrated circuit die can include a flip chip, a wire bonded chip, or a packaged integrated circuit.

The active side, having a redistribution layer 704, of the device mounting structure 706 can be exposed within the opening 708. The redistribution layer 704 is defined as a structure that provides electrical connectivity between one component to another component. For example, the another device (not shown) can be mounted on the redistribution layer 704 for connecting signals between the integrated circuit packaging system 700 and another device. The redistribution layer 704 can be mounted on the active side of the device mounting structure 706.

It has been discovered that having the heat spreader 702 with the opening 708 having the opening center 712 allows the opportunity to stack another device (not shown) on the integrated circuit packaging system 700. The ability to stack another device in the opening 708 can reduce the profile of the various semiconductor devices, such as Fan-in Package on package (Fi-PoP), thus, lowering the production cost.

It has also been discovered that having the heat spreader 702 with the opening 708 allows evenly spaced dissipation of heat from the center or interior of the integrated circuit packaging system 700 and another device stacked on the integrated circuit packaging system 700. As a result, the heat spreader 702 improves the thermal performance of the integrated circuit packaging system 700. Improving the thermal performance of the integrated circuits increases board level reliability and performance of the semiconductor device. The thermally-enhanced package design of the present invention can be applied to various semiconductor devices, thus, lowering the production cost.

Figure 8:
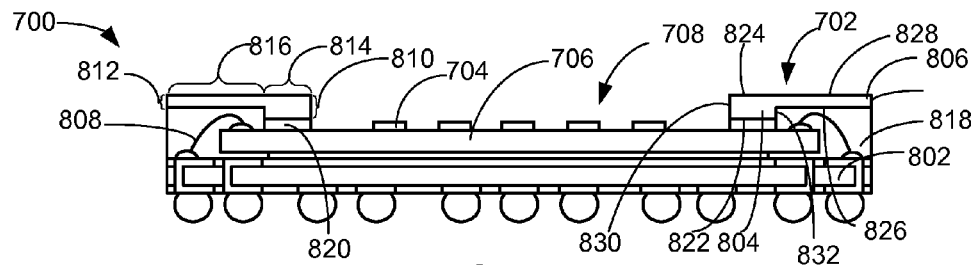
FIG. 8 is a cross-sectional view of the integrated circuit packaging system along the line 8-8 of FIG. 7.

Referring now to FIG. 8, therein is shown a cross-sectional view of the integrated circuit packaging system 700 along the line 8-8 of FIG. 7. The integrated circuit packaging system 700 can include a bottom substrate 802 with the device mounting structure 706 mounted over the bottom substrate 802. The bottom substrate 802 is defined as a mounting structure for an integrated circuit or other electrical components as well as providing electrical connections between, to, and from the devices mounted thereto.

The integrated circuit packaging system 700 can include a peripheral electrical interconnect 808, which is defined as a connection interface for electrical connection to other components. For example, the peripheral electrical interconnect 808 can include a bondwire, conductive columns, solder balls, or conductive interconnects. For this example, the peripheral electrical interconnect 808 can represent a bondwire for z-interconnect between the bottom substrate 802 and the device mounting structure 706.

The heat spreader 702 can be a single integral structure having a dam 804 and a flange 806 that bounds the opening 708 of the heat spreader 702. The dam 804 is defined as a portion of the heat spreader 702 that forms a boundary of the opening 708. The flange 806 is defined as a portion of the heat spreader 702 extending from the dam 804.

The integrated circuit packaging system 700 can include the heat spreader 702 mounted over the device mounting structure 706 with a top adhesive 820 attaching the heat spreader 702 to the active side of the device mounting structure 706. The top adhesive is defined as a sticky material for holding components in place.

The integrated circuit packaging system 700 can include the heat spreader 702, the heat spreader 702 having the opening 708 formed by a single integral structure with the dam 804 and the flange 806, the dam 804 having a dam height 810 greater than a flange height 812 of the flange 806. For example, the dam height 810 can be greater than twice of the flange height 812.

The dam height 810 can represent the non-horizontal distance between a dam bottom side 822 and a dam topside 824. The flange height 812 can represent the non-horizontal distance between a flange bottom side 826 and a flange topside 828.

It has been discovered that the heat spreader 702 can provide electromagnetic isolation between the integrated circuit packaging system 700 and another device (not shown) stacked on the integrated circuit packaging system 700. The dam height 810 being greater than the flange height 812 allows additional space for the peripheral electrical interconnect 808 to be mounted on the bottom substrate 802 and under the flange 806. As a result, the heat spreader 702 can provide electromagnetic isolation between the integrated circuit packaging system 700 and another device stacked on the device mounting structure 706, thus improving board level reliability and performance of the semiconductor device.

For another example, the integrated circuit packaging system 700 can include the heat spreader 702 having the opening 708 bounded by the dam 804, the dam 804 having a dam width 814 less than a flange width 816. The flange width 816 can be greater than twice of the dam width 814.

The flange width 816 can represent the non-vertical distance between a dam outer side 832 and the perimeter edge 714. The dam outer side 832 is defined as the side of the dam 804 facing away from the opening 708. The dam width 814 can represent the non-vertical distance between the dam outer side 832 and a dam inner side 830, which is defined as the side of the dam 804 facing the opening 708. A top planar portion of the heat spreader 702 can represent the total non-vertical distance combining the dam width 814 and the flange width 816.

The integrated circuit packaging system 700 can include a package encapsulation 818. The package encapsulation 818 is defined as a cover surrounding and protecting the contents in the integrated circuit packaging system 700 from the environment and hermetically seals the contents internal to the integrated circuit packaging system 700. For example, the package encapsulation 818 can be formed under the flange 806.

It has been discovered that the dam 804 and the top adhesive 820 can prevent mold flash, bleed contamination, or a combination thereof on the redistribution layer 704 mounted on the active side of the device mounting structure 706. As a result, exposure of the redistribution layer 704 without the risk of mold flash, bleed contamination, or a combination thereof allows the stacking of another device. As a result, the thermally-enhanced package design of the present invention can be applied to various semiconductor devices, thus, lowering the production cost.

It has been also discovered that the ability of the heat spreader 702 to act as dam material can allow the conventional molding method without a dedicated mold chase. As a result, the cost of a dedicated mold chase can be eliminated, thus, reducing fabrication cost.

It has been further discovered that the dam 804 can act as a stiffener to minimize warpage on the device mounting structure 706. The minimization of warpage improves the structural reliability of the integrated circuit packaging system 700. Additionally, the improvement of the structural reliability increases board level reliability and performance of the semiconductor device. Therefore, the thermally-enhanced package design of the present invention can be applied to various semiconductor devices, thus, lowering the production cost.

Figure 9:
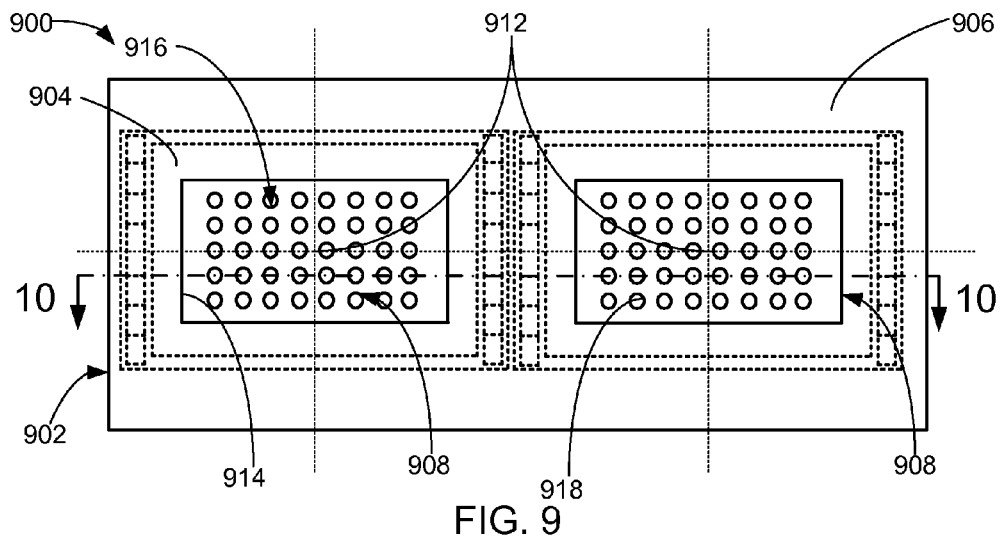
FIG. 9 is a top view of an integrated circuit packaging system in a fifth embodiment of the present invention.

Referring now to FIG. 9, therein is shown a top view of an integrated circuit packaging system 900 in a fifth embodiment of the present invention. The dotted lines provide illustrations of the elements of the present invention, but are not actually shown from the top view. The integrated circuit packaging system 900 can include a heat spreader 902, which is defined as a conductive structure that transfers heat and electricity generated within the integrated circuit packaging system 900 to the external environment. The term "external" refers to outside the integrated circuit packaging system 900. For example, the heat spreader 902 can be a heat shield or an electromagnetic interference (EMI) shield.

The heat spreader 902 can be a single integral structure having a dam 904 and a flange 906 that bounds an opening 908 of the heat spreader 902. The dam 904 is defined as a portion of the heat spreader 902 that forms a boundary of the opening 908. The flange 906 is defined as a portion of the heat spreader 902 extending from the dam. An opening center 912 is defined as the centrally located with equal distance from a dam inner side 914 facing the opening 908 that bounds the opening 908. The dam inner side 914 is defined as the side of the dam 904 facing the opening 908. The heat spreader 902 can include more than one opening representing the opening 908.

A device mounting structure 916 can be exposed within the opening 908. The device mounting structure 916 is defined as an electrical interface routing structure. For example, the device mounting structure 916 can include an interposer, a laminated substrate, or a ceramic substrate. The device mounting structure 916 can include a connection side 918, which is defined as the side of the device mounting structure 916 for connecting signals to the next system level. For example, the connection side 918 can be exposed within the opening 908 of the heat spreader 902.

It has been discovered that having the heat spreader 902 with the opening 908 having the opening center 912 allows the opportunity to stack another device (not shown) on the integrated circuit packaging system 900. The ability to stack another device in the opening 908 can reduce the profile of the various semiconductor devices, such as Fan-in Package on package (Fi-PoP), thus, lowering the production cost.

It has also been discovered that having the heat spreader 902 with the opening 908 allows evenly spaced dissipation of heat from the center or interior of the integrated circuit packaging system 900 and another device stacked on the integrated circuit packaging system 900. As a result, the heat spreader 902 improves the thermal performance of the integrated circuit packaging system 900. Improving the thermal performance of the integrated circuits increases board level reliability and performance of the semiconductor device. The thermally-enhanced package design of the present invention can be applied to various semiconductor devices, thus, lowering the production cost.

Figure 10:
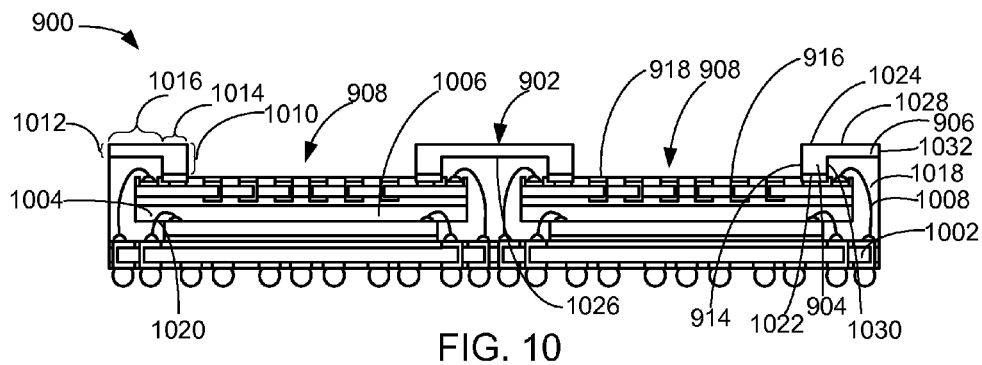
FIG. 10 is a cross-sectional view of the integrated circuit packaging system along the line 10-10 of FIG. 9.

Referring now to FIG. 10, therein is shown a cross-sectional view of the integrated circuit packaging system 900 along the line 10-10 of FIG. 9. The integrated circuit packaging system 900 can include a bottom substrate 1002 with an inner integrated circuit 1006 over the bottom substrate 1002.

The bottom substrate 1002 is defined as a mounting structure for an integrated circuit or other electrical components as well as providing electrical connections between, to, and from the devices mounted thereto. The inner integrated circuit 1006 is defined as chip with active circuitry fabricated thereon. For example, the inner integrated circuit 1006 can include a flip chip, a wire bonded chip, or a packaged integrated circuit. For further example, the bottom substrate 1002 can have more than one of the inner integrated circuit 1006 mounted over the bottom substrate 1002.

The integrated circuit packaging system 900 can include a wire-in-film adhesive 1004 on an active side of the inner integrated circuit 1006. The wire-in-film adhesive 1004 is defined as a sticky material for holding components in place having an inner electrical interconnect 1020 in the sticky material. The inner electrical interconnect 1020 is defined as a connection interface for electrical connection to other components. For example, the inner electrical interconnect 1020 can include a bondwire, conductive columns, solder balls, or conductive interconnects. The inner electrical interconnect 1020 can provide electrical connection between the bottom substrate 1002 and the inner integrated circuit 1006.

The wire-in-film adhesive 1004 can be mounted on the inner integrated circuit 1006 and over the bottom substrate 1002. The device mounting structure 916 can be mounted on the wire-in-film adhesive 1004.

The integrated circuit packaging system 900 can include a peripheral electrical interconnect 1008, which is defined as a connection interface for electrical connection to other components. For example, the peripheral electrical interconnect 1008 can include a bondwire, conductive columns, solder balls, or conductive interconnects. For this example, the peripheral electrical interconnect 1008 can represent a bondwire for z-interconnect between the bottom substrate 1002 and the device mounting structure 916.

The integrated circuit packaging system 900 can include the heat spreader 902, the heat spreader 902 having the opening 908 formed by a single integral structure with the dam 904 and the flange 906, the dam 904 having a dam height 1010 greater than a flange height 1012 of the flange 906. For example, the dam height 1010 can be greater than twice of the flange height 1012.

The dam height 1010 can represent the non-horizontal distance between a dam bottom side 1022 and a dam topside 1024. The flange height 1012 can represent the non-horizontal distance between a flange bottom side 1026 and a flange topside 1028.

It has been discovered that the heat spreader 902 can provide electromagnetic isolation between the integrated circuit packaging system 900 and another device (not shown) stacked on the integrated circuit packaging system 900. The dam height 1010 being greater than the flange height 1012 allows additional space for the peripheral electrical interconnect 1008 to be mounted on the bottom substrate 1002 and under the flange 906. As a result, the heat spreader 902 can provide electromagnetic isolation between the integrated circuit packaging system 900 and another device stacked on the device mounting structure 916, thus improving board level reliability and performance of the semiconductor device.

For another example, the integrated circuit packaging system 900 can include the heat spreader 902 having the opening 908 bounded by the dam 904, the dam 904 having a dam width 1014 less than a flange width 1016. The flange width 1016 can be greater than twice of the dam width 1014.

The flange width 1016 can represent the non-vertical distance between a dam outer side 1030 and a heat spreader edge 1032. The dam outer side 1030 is defined as the side of the dam 904 facing away from the opening 908. The dam width 1014 can represent the non-vertical distance between the dam outer side 1030 and the dam inner side 914. A top planar portion of the heat spreader 902 can represent the total non-vertical distance combining the dam width 1014 and the flange width 1016.

The integrated circuit packaging system 900 can include the opening 908 of the heat spreader 902 having each of the connection side 918 of the device mounting structure 916 exposed. From this cross-sectional view, two of the device mounting structure 916 can be mounted on two of the inner integrated circuit 1006. The connection side 918 of the each of the device mounting structure 916 can be exposed within each of the opening 908 illustrated.

The integrated circuit packaging system 900 can include a package encapsulation 1018. The package encapsulation 1018 is defined as a cover surrounding and protecting the contents in the integrated circuit packaging system 900 from the environment and hermetically seals the contents internal to the integrated circuit packaging system 900. For example, the package encapsulation 1018 can be formed under the flange 906.

It has been discovered that the dam 904 can prevent mold flash, bleed contamination, or a combination thereof on a connection pad exposed on the connection side 918 of the device mounting structure 916. As a result, exposure of the connection side 918 without the risk of mold flash, bleed contamination, or a combination thereof allows the stacking of another device. As a result, the thermally-enhanced package design of the present invention can be applied to various semiconductor devices, thus, lowering the production cost.

It has been also discovered that the ability of the heat spreader 902 to act as dam material can allow the conventional molding method without a dedicated mold chase. As a result, the cost of a dedicated mold chase can be eliminated, thus, reducing fabrication cost.

It has been further discovered that the dam 904 can act as a stiffener to minimize warpage on the inner integrated circuit 1006 or the device mounting structure 916. The minimization of warpage improves the structural reliability of the integrated circuit packaging system 900. Additionally, the improvement of the structural reliability increases board level reliability and performance of the semiconductor device. Therefore, the thermally-enhanced package design of the present invention can be applied to various semiconductor devices, thus, lowering the production cost.

Figure 11:
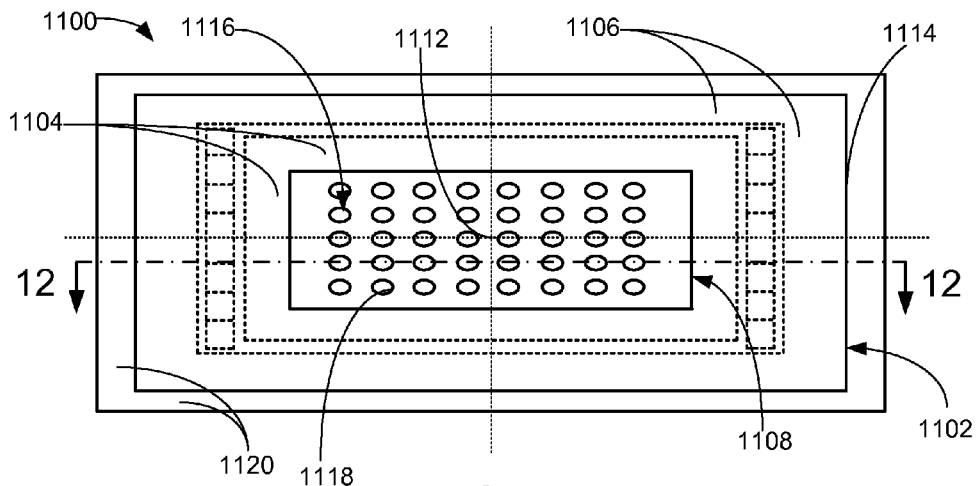
FIG. 11 is a top view of an integrated circuit packaging system in a sixth embodiment of the present invention.

Referring now to FIG. 11, therein is shown a top view of an integrated circuit packaging system 1100 in a sixth embodiment of the present invention. The dotted lines provide illustrations of the elements of the present invention, but are not actually shown from the top view. The integrated circuit packaging system 1100 can include a heat spreader 1102, which is defined as a conductive structure that transfers heat and electricity generated within the integrated circuit packaging system 1100 to the external environment. The term "external" refers to outside the integrated circuit packaging system 1100. For example, the heat spreader 1102 can be a heat shield or an electromagnetic interference (EMI) shield.

The heat spreader 1102 can be a single integral structure having a dam 1104 and a flange 1106 that bounds an opening 1108 of the heat spreader 1102. The dam 1104 is defined as a portion of the heat spreader 1102 that forms a boundary of the opening 1108. The flange 1106 is defined as a portion of the heat spreader 1102 extending from the dam. An opening center 1112 is defined as the centrally located with equal distance from a perimeter edge 1114 of the heat spreader 1102.

A device mounting structure 1116 can be exposed within the opening 1108. The device mounting structure 1116 is defined as an electrical interface routing structure. For example, the device mounting structure 1116 can include an interposer, a laminated substrate, or a ceramic substrate. The device mounting structure 1116 can include a connection side 1118, which is defined as the side of the device mounting structure 1116 for connecting signals to the next system level. For example, the connection side 1118 can be exposed within the opening 1108 of the heat spreader 1102.

It has been discovered that having the heat spreader 1102 with the opening 1108 having the opening center 1112 allows the opportunity to stack another device (not shown) on the integrated circuit packaging system 1100. The ability to stack another device in the opening 1108 can reduce the profile of the various semiconductor devices, such as Fan-in Package on package (Fi-PoP), thus, lowering the production cost.

It has also been discovered that having the heat spreader 1102 with the opening 1108 allows evenly spaced dissipation of heat from the center or interior of the integrated circuit packaging system 1100 and another device stacked on the integrated circuit packaging system 1100. As a result, the heat spreader 1102 improves the thermal performance of the integrated circuit packaging system 1100. Improving the thermal performance of the integrated circuits increases board level reliability and performance of the semiconductor device. The thermally-enhanced package design of the present invention can be applied to various semiconductor devices, thus, lowering the production cost.

The integrated circuit packaging system 1100 can include a package encapsulation 1120. The package encapsulation 1120 is defined as a cover surrounding and protecting the contents in the integrated circuit packaging system 1100 from the environment and hermetically seals the contents internal to the integrated circuit packaging system 1100.

Figure 12:
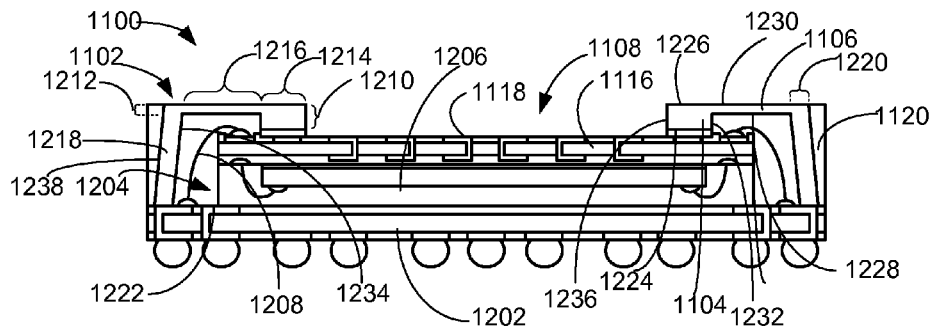
FIG. 12 is a cross-sectional view of the integrated circuit packaging system along the line 12-12 of FIG. 11.

Referring now to FIG. 12, therein is shown a cross-sectional view of the integrated circuit packaging system 1100 along the line 12-12 of FIG. 11. The integrated circuit packaging system 1100 can include a bottom substrate 1202 with an inner package 1204, having an inner integrated circuit 1206, on the bottom substrate 1202.

The bottom substrate 1202 is defined as a mounting structure for an integrated circuit or other electrical components as well as providing electrical connections between, to, and from the devices mounted thereto. The inner integrated circuit 1206 is defined as chip with active circuitry fabricated thereon. For example, the inner integrated circuit 1206 can include a flip chip, a wire bonded chip, or a packaged integrated circuit. The inner integrated circuit 1206 can be mounted over the bottom substrate 1202.

The inner package 1204 is defined as a packaged integrated circuit that can be mounted on other package or structures, or receive other packages. For example, the inner package 1204 can include the inner integrated circuit 1206 representing a wire bond chip or a flip chip. The inner package 1204 can include the device mounting structure 1116.

The integrated circuit packaging system 1100 can include a peripheral electrical interconnect 1208, which is defined as a connection interface for electrical connection to other components. For example, the peripheral electrical interconnect 1208 can include a bondwire, conductive columns, solder balls, or conductive interconnects. For this example, the peripheral electrical interconnect 1208 can represent a bondwire for z-interconnect between the bottom substrate 1202 and the device mounting structure 1116.

The integrated circuit packaging system 1100 can include the heat spreader 1102, the heat spreader 1102 having the opening 1108 formed by a single integral structure with the dam 1104 and the flange 1106, the dam 1104 having a dam height 1210 greater than a flange height 1212 of the flange 1106. For example, the dam height 1210 can be greater than twice of the flange height 1212.

The dam height 1210 can represent the non-horizontal distance between a dam bottom side 1224 and a dam topside 1226. The flange height 1212 can represent the non-horizontal distance between a flange bottom side 1228 and a flange topside 1230.

It has been discovered that the heat spreader 1102 can provide electromagnetic isolation between the integrated circuit packaging system 1100 and another device (not shown) stacked on the integrated circuit packaging system 1100. The dam height 1210 being greater than the flange height 1212 allows additional space for the peripheral electrical interconnect 1208 to be mounted on the bottom substrate 1202 and under the flange 1106. As a result, the heat spreader 1102 can provide electromagnetic isolation between the integrated circuit packaging system 1100 and another device stacked on the device mounting structure 1116, thus improving board level reliability and performance of the semiconductor device.

For another example, the integrated circuit packaging system 1100 can include the heat spreader 1102 having the opening 1108 bounded by the dam 1104, the dam 1104 having a dam width 1214 less than a flange width 1216. The flange width 1216 can be greater than twice of the dam width 1214.

The flange width 1216 can represent the non-vertical distance between a dam outer side 1232 and a leg inner side 1234. The dam outer side 1232 is defined as the side of the dam 1104 facing away from the opening 1108. The leg inner side 1234 is defined as the side of a peripheral leg 1218 facing towards the opening 1108. The dam width 1214 can represent the non-vertical distance between the dam outer side 1232 and a dam inner side 1236, which is defined as the side of the dam 1104 facing the opening 1108.

The heat spreader 1102 can include the peripheral leg 1218 extending from the flange 1106 with the dam topside 1226 and the flange topside 1230 of the heat spreader 1102 exposed from the package encapsulation 1120. The peripheral leg 1218 can extend from the flange topside 1230 in an obtuse angle with the obtuse angle facing towards the bottom substrate 1202. Furthermore, the dam width 1214 can be greater than a leg width 1220 of the peripheral leg 1218. The leg width 1220 can represent the non-vertical distance between the leg inner side 1234 and a leg outer side 1238, which is defined as the side of the peripheral leg 1218 facing away the opening 1108. The peripheral leg 1218 can directly be on a substrate topside 1222 of the bottom substrate 1202. A top planar portion of the heat spreader 1102 can represent the total non-vertical distance combining the dam width 1214, the flange width 1216 and the leg width 1220.

It has been discovered that the dam 1104 can prevent mold flash, bleed contamination, or a combination thereof on a connection pad exposed on the connection side 1118 of the device mounting structure 1116. As a result, exposure of the connection side 1118 without the risk of mold flash, bleed contamination, or a combination thereof allows the stacking of another device. As a result, the thermally-enhanced package design of the present invention can be applied to various semiconductor devices, thus, lowering the production cost.

It has been also discovered that the ability of the heat spreader 1102 to act as dam material can allow the conventional molding method without a dedicated mold chase. As a result, the cost of a dedicated mold chase can be eliminated, thus, reducing fabrication cost.

It has been further discovered that the dam 1104 can act as a stiffener to minimize warpage on the inner package 1204 or the device mounting structure 1116. The minimization of warpage improves the structural reliability of the integrated circuit packaging system 1100. Additionally, the improvement of the structural reliability increases board level reliability and performance of the semiconductor device. Therefore, the thermally-enhanced package design of the present invention can be applied to various semiconductor devices, thus, lowering the production cost.

It has been further discovered that the heat spreader 1102 having the peripheral leg 1218 connected to the substrate topside 1222 of the bottom substrate 1202 improves the thermal performance of the integrated circuit packaging system 1100. The peripheral leg 1218 improves efficiency for heat dissipation for the inner package 1204, thus, improving board level reliability and performance.

Figure 13:
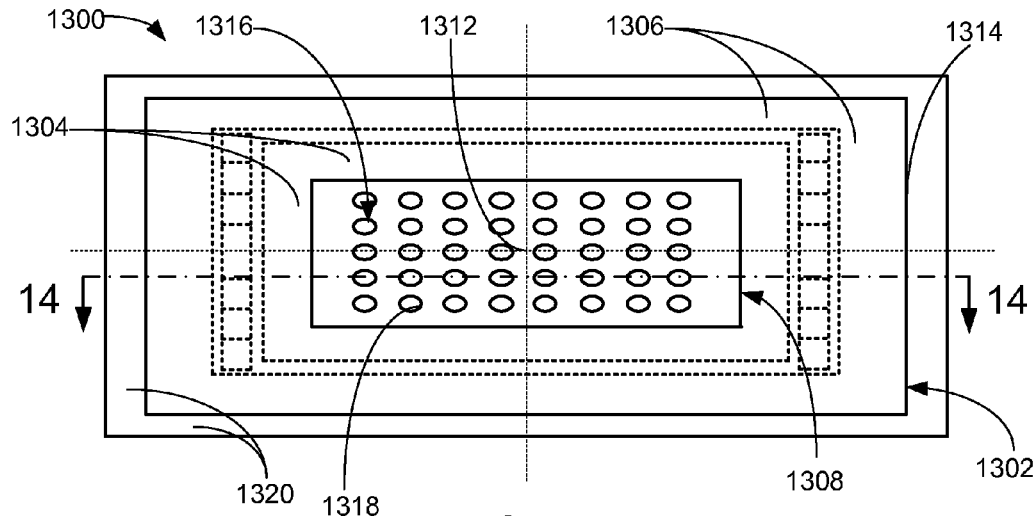
FIG. 13 is a top view of an integrated circuit packaging system in a seventh embodiment of the present invention.

Referring now to FIG. 13, therein is shown a top view of an integrated circuit packaging system 1300 in a seventh embodiment of the present invention. The dotted lines provide illustrations of the elements of the present invention, but are not actually shown from the top view. The integrated circuit packaging system 1300 can include a heat spreader 1302, which is defined as a conductive structure that transfers heat and electricity generated within the integrated circuit packaging system 1300 to the external environment. The term "external" refers to outside the integrated circuit packaging system 1300. For example, the heat spreader 1302 can be a heat shield or an electromagnetic interference (EMI) shield.

The heat spreader 1302 can be a single integral structure having a dam 1304 and a flange 1306 that bounds an opening 1308 of the heat spreader 1302. The dam 1304 is defined as a portion of the heat spreader 1302 that forms a boundary of the opening 1308. The flange 1306 is defined as a portion of the heat spreader 1302 extending from the dam. An opening center 1312 is defined as the centrally located with equal distance from a perimeter edge 1314 of the heat spreader 1302.

A device mounting structure 1316 can be exposed within the opening 1308. The device mounting structure 1316 is defined as an electrical interface routing structure. For example, the device mounting structure 1316 can include an interposer, a laminated substrate, or a ceramic substrate. The device mounting structure 1316 can include a connection side 1318, which is defined as the side of the device mounting structure 1316 for connecting signals to the next system level. For example, the connection side 1318 can be exposed within the opening 1308 of the heat spreader 1302.

It has been discovered that having the heat spreader 1302 with the opening 1308 having the opening center 1312 allows the opportunity to stack another device (not shown) on the integrated circuit packaging system 1300. The ability to stack another device in the opening 1308 can reduce the profile of the various semiconductor devices, such as Fan-in Package on package (Fi-PoP), thus, lowering the production cost.

It has also been discovered that having the heat spreader 1302 with the opening 1308 allows evenly spaced dissipation of heat from the center or interior of the integrated circuit packaging system 1300 and another device stacked on the integrated circuit packaging system 1300. As a result, the heat spreader 1302 improves the thermal performance of the integrated circuit packaging system 1300. Improving the thermal performance of the integrated circuits increases board level reliability and performance of the semiconductor device. The thermally-enhanced package design of the present invention can be applied to various semiconductor devices, thus, lowering the production cost.

The integrated circuit packaging system 1300 can include a package encapsulation 1320. The package encapsulation 1320 is defined as a cover surrounding and protecting the contents in the integrated circuit packaging system 1300 from the environment and hermetically seals the contents internal to the integrated circuit packaging system 1300.

Figure 14:
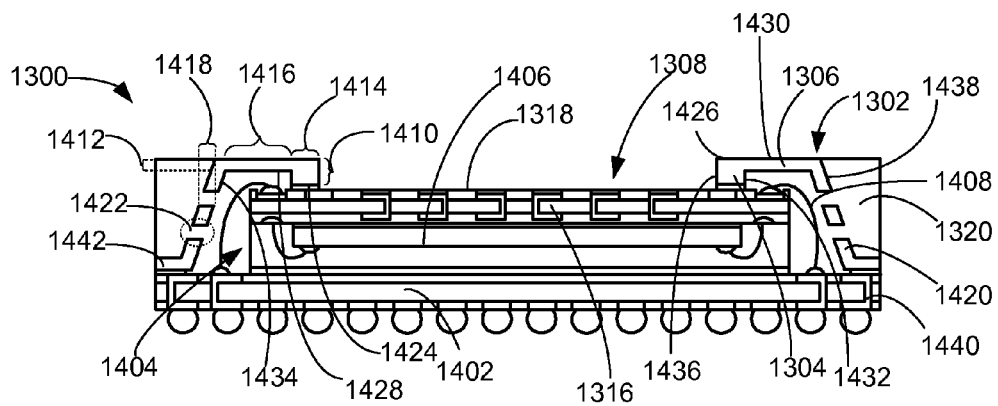
FIG. 14 is a cross-sectional view of the integrated circuit packaging system as along the line 14-14 of FIG. 13.

Referring now to FIG. 14, therein is shown a cross-sectional view of the integrated circuit packaging system 1300 along the line 14-14 of FIG. 13. The integrated circuit packaging system 1300 can include a bottom substrate 1402 with an inner package 1404, having an inner integrated circuit 1406, on the bottom substrate 1402.

The bottom substrate 1402 is defined as a mounting structure for an integrated circuit or other electrical components as well as providing electrical connections between, to, and from the devices mounted thereto. The inner integrated circuit 1406 is defined as chip with active circuitry fabricated thereon. For example, the inner integrated circuit 1406 can include a flip chip, a wire bonded chip, or a packaged integrated circuit. The inner integrated circuit 1406 can be mounted over the bottom substrate 1402.

The inner package 1404 is defined as a packaged integrated circuit that can be mounted on other package or structures, or receive other packages. For example, the inner package 1404 can include the inner integrated circuit 1406 representing a wire bond chip or a flip chip. The inner package 1404 can include the device mounting structure 1316.

The integrated circuit packaging system 1300 can include a peripheral electrical interconnect 1408, which is defined as a connection interface for electrical connection to other components. For example, the peripheral electrical interconnect 1408 can include a bondwire, conductive columns, solder balls, or conductive interconnects. For this example, the peripheral electrical interconnect 1408 can represent a bondwire for z-interconnect between the bottom substrate 1402 and the device mounting structure 1316.

The integrated circuit packaging system 1300 can include the heat spreader 1302, the heat spreader 1302 having the opening 1308 formed by a single integral structure with the dam 1304 and the flange 1306, the dam 1304 having a dam height 1410 greater than a flange height 1412 of the flange 1306. For example, the dam height 1410 can be greater than twice of the flange height 1412.

The dam height 1410 can represent the non-horizontal distance between a dam bottom side 1424 and a dam topside 1426. The flange height 1412 can represent the non-horizontal distance between a flange bottom side 1428 and a flange topside 1430.

It has been discovered that the heat spreader 1302 can provide electromagnetic isolation between the integrated circuit packaging system 1300 and another device (not shown) stacked on the integrated circuit packaging system 1300. The dam height 1410 being greater than the flange height 1412 allows additional space for the peripheral electrical interconnect 1408 to be mounted on the bottom substrate 1402 and under the flange 1306. As a result, the heat spreader 1302 can provide electromagnetic isolation between the integrated circuit packaging system 1300 and another device stacked on the device mounting structure 1316, thus improving board level reliability and performance of the semiconductor device.

For another example, the integrated circuit packaging system 1300 can include the heat spreader 1302 having the opening 1308 bounded by the dam 1304, the dam 1304 having a dam width 1414 less than a flange width 1416. The flange width 1416 can be greater than twice of the dam width 1414.

The flange width 1416 can represent the non-vertical distance between a dam outer side 1432 and a leg inner side 1434. The dam outer side 1432 is defined as the side of the dam 1304 facing away from the opening 1308. The leg inner side 1434 is defined as the side of a peripheral leg 1420 facing towards the opening 1308. The dam width 1414 can represent the non-vertical distance between the dam outer side 1432 and a dam inner side 1436, which is defined as the side of the dam 1304 facing the opening 1308.

The heat spreader 1302 can include the peripheral leg 1420 extending from the flange 1306 with the dam topside 1426 and the flange topside 1430 of the heat spreader 1302 exposed from the package encapsulation 1320. The peripheral leg 1420 can extend from the flange topside 1430 in an obtuse angle with the obtuse angle facing towards the bottom substrate 1402. Furthermore, the dam width 1414 can be greater than a leg width 1418 of the peripheral leg 1420. The leg width 1418 can represent the non-vertical distance between the leg inner side 1434 and a leg outer side 1438, which is defined as the side of the peripheral leg 1420 facing away the opening 1308. A top planar portion of the heat spreader 1302 can represent the total non-vertical distance combining the dam width 1414, the flange width 1416 and the leg width 1418.

The peripheral leg 1420 can include a plate hole 1422, which is defined as an opening on the heat spreader 1302. For example, the heat spreader 1302 can include multiple numbers of the plate hole 1422. For further example, the plate hole 1422 can come in shapes of circle, triangle, square, or a combination thereof.

The heat spreader 1302 can include a 1442 extending from the peripheral leg 1420 with the foot directly connected to a peripheral thermal via 1440 of the bottom substrate 1402. The peripheral thermal via 1440 is defined as a hole filled with electrically conductive material that provides a thermal path, a conductive path, or a combination thereof. For example, the peripheral thermal via 1440 can support the ground connection for the heat spreader 1302.

It has been discovered that the dam 1304 can prevent mold flash, bleed contamination, or a combination thereof on a connection pad exposed on the connection side 1318 of the device mounting structure 1316. As a result, exposure of the connection side 1318 without the risk of mold flash, bleed contamination, or a combination thereof allows the stacking of another device. As a result, the thermally-enhanced package design of the present invention can be applied to various semiconductor devices, thus, lowering the production cost.

It has been also discovered that the ability of the heat spreader 1302 to act as dam material can allow the conventional molding method without a dedicated mold chase. As a result, the cost of a dedicated mold chase can be eliminated, thus, reducing fabrication cost.

It has been further discovered that the dam 1304 can act as a stiffener to minimize warpage on the inner package 1404 or the device mounting structure 1316. The minimization of warpage improves the structural reliability of the integrated circuit packaging system 1300. Additionally, the improvement of the structural reliability increases board level reliability and performance of the semiconductor device. Therefore, the thermally-enhanced package design of the present invention can be applied to various semiconductor devices, thus, lowering the production cost.

It has been further discovered that the heat spreader 1302 having the peripheral leg 1420 and the 1442 connected to the peripheral thermal via 1440 of the bottom substrate 1402 improves the thermal performance of the integrated circuit packaging system 1300. The peripheral leg 1420 improves efficiency for heat dissipation for the inner package 1404, thus, improving board level reliability and performance.

Figure 15:
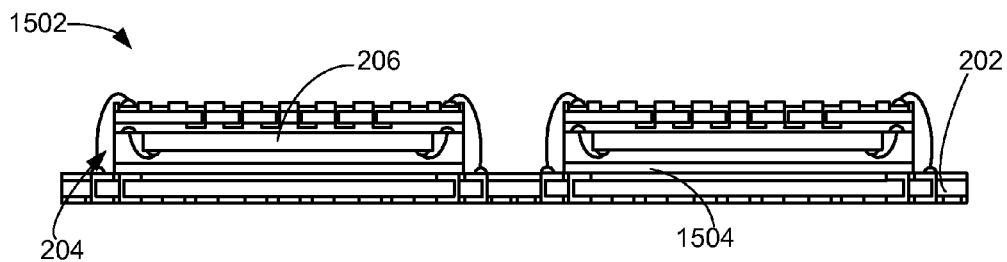
FIG. 15 is a cross-sectional view of a structure for manufacture of the integrated circuit packaging system of FIG. 1 after mounting phase of the manufacture.

Referring now to FIG. 15, therein is a cross-sectional view of a structure 1502 for manufacture of the integrated circuit packaging system 100 of FIG. 1 after mounting phase of the manufacture. The structure 1502 can include the inner package 204 having the inner integrated circuit 206 mounted over the bottom substrate 202. The inner package 204 can be attached to the bottom substrate 202 with a bottom adhesive 1504, which is defined as a sticky material to hold components in place.

Figure 16:
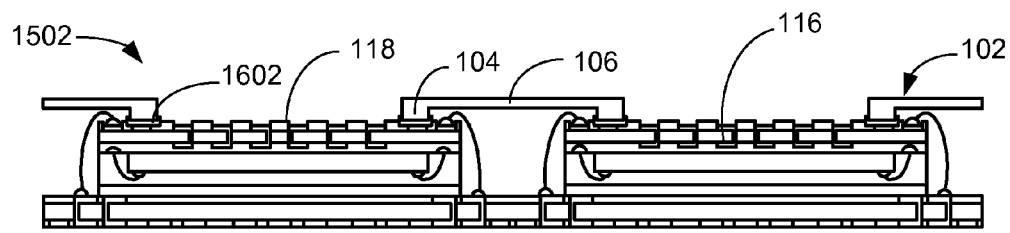
FIG. 16 is a cross-sectional view of the structure for manufacture of the integrated circuit packaging system of FIG. 1 after mounting phase of the manufacture.

Referring now to FIG. 16, therein is a cross-sectional view of the structure 1502 for manufacture of the integrated circuit packaging system 100 of FIG. 1 after mounting phase of the manufacture. The structure 1502 can include the heat spreader 102 having the dam 104 and the flange 106 extending from the dam 104. The heat spreader 102 can be attached to the connection side 118 of the device mounting structure 116 with a top adhesive 1602, which is defined as a sticky material that holds components in place.

Figure 17:
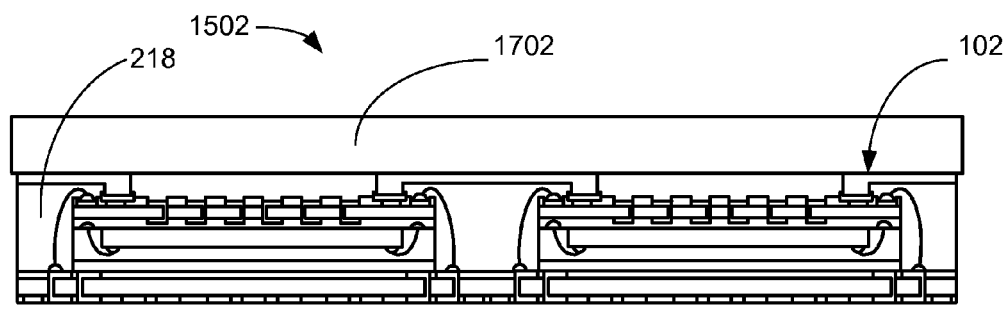
FIG. 17 is a cross-sectional view of the structure for manufacture of the integrated circuit packaging system of FIG. 1 after a mode phase of the manufacture.

Referring now to FIG. 17, therein is a cross-sectional view of the structure 1502 for manufacture of the integrated circuit packaging system 100 of FIG. 1 after a mode phase of the manufacture. The package encapsulation 218 can be molded on the structure 1502 by using a mold chase 1702. The mold chase 1702 can include a flat-panel standard mold chase. Furthermore, only the heat spreader 102 can contact the mode chase 1702 during the mode phase of the present manufacture.

It has been also discovered that the ability of the heat spreader 102 to act as dam material can allow the conventional molding method without a dedicated mold chase. As a result, the cost of a dedicated mold chase can be eliminated, thus, reducing fabrication cost.

Figure 18:
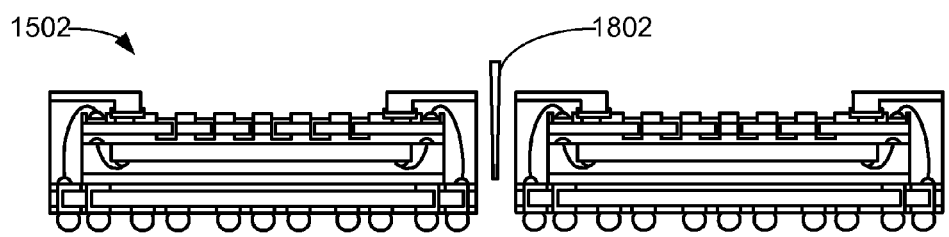
FIG. 18 is a cross-sectional view of the structure for manufacture of the integrated circuit packaging system of FIG. 1 after the singulation phase of the manufacture.

Referring now to FIG. 18, therein is a cross-sectional view of the structure 1502 for manufacture of the integrated circuit packaging system 100 of FIG. 1 after the singulation phase of the manufacture. The structure 1502 can be singulated by a dicer 1802 to create individual units of the integrated circuit packaging system 100.

Figure 19:
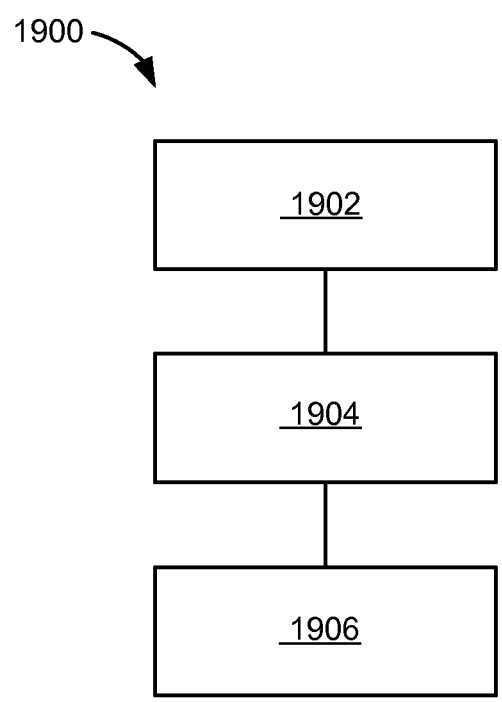
FIG. 19 is a flow chart of a method of manufacture of an integrated circuit packaging system in a further embodiment of the present invention.

Referring now to FIG. 19 is a flow chart of a method 1900 of manufacture of an integrated circuit packaging system in a further embodiment of the present invention. The dotted lines provide illustrations of the elements of the present invention, but are not actually shown from the top view. The method 1900 includes: mounting a device mounting structure over a bottom substrate in a block 1902; mounting a heat spreader having an opening formed by a single integral structure with a dam and a flange, the dam having a dam height greater than a flange height of the flange in a block 1904; and forming a package encapsulation over the device mounting structure and the bottom substrate with the device mounting structure exposed within the opening in a block 1906.

Thus, it has been discovered that the integrated circuit packaging system of the present invention furnishes important and heretofore unknown and unavailable solutions, capabilities, and functional aspects for an integrated circuit packaging system with encapsulation. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   mounting a device mounting structure over a bottom substrate;
   mounting a heat spreader having an opening formed by a single integral structure with a dam and a flange, the dam having a dam height greater than a flange height of the flange; and
   forming a package encapsulation over the device mounting structure and the bottom substrate and under the heat spreader with the device mounting structure exposed within the opening, the package encapsulation in contact with the dam only on a dam outer side of the dam, the package encapsulation in contact with the flange only on a flange bottom side, a side of the package encapsulation coplanar with a perimeter edge of the heat spreader.

2. The method as claimed in claim 1 wherein mounting the heat spreader includes mounting the heat spreader having the opening bounded by the dam, the dam having a dam width less than a flange width of the flange.

3. The method as claimed in claim 1 wherein mounting the heat spreader includes mounting the heat spreader over a connection side of the device mounting structure with the connection side exposed within the opening of the heat spreader.

4. The method as claimed in claim 1 further comprising:
   mounting the device mounting structure over the bottom substrate; and
   wherein:
   mounting the heat spreader includes mounting the heat spreader having the opening with an opening center offset from a device mounting structure center of the device mounting structure.

5. The method as claimed in claim 1 further comprising mounting an inner integrated circuit over the bottom substrate.

6. A method of manufacture of an integrated circuit packaging system comprising:
   mounting an inner integrated circuit over a bottom substrate;
   mounting a device mounting structure over the bottom substrate, the device mounting structure over the inner integrated circuit;
   mounting a heat spreader having an opening bounded by a single integral structure with a dam and a flange, the dam having a dam height greater than a flange height of the flange; and
   forming a package encapsulation over the device mounting structure and the bottom substrate and under the heat spreader with the device mounting structure exposed within the opening, the package encapsulation in contact with the dam only on a dam outer side of the dam, the package encapsulation in contact with the flange only on a flange bottom side, a side of the package encapsulation coplanar with a perimeter edge of the heat spreader.

7. The method as claimed in claim 6 wherein mounting the inner integrated circuit includes mounting the inner integrated circuit on the bottom substrate.

8. The method as claimed in claim 6 further comprising mounting a wire-in-film adhesive on the inner integrated circuit.

9. The method as claimed in claim 6 further comprising:
   mounting a redistribution layer on the device mounting structure; and
   wherein:
   mounting the heat spreader includes mounting the heat spreader with the redistribution layer exposed within the opening.

10. The method as claimed in claim 6 further comprising:
    mounting an inner package having the device mounting structure over the bottom substrate; and
    wherein:
    mounting the heat spreader includes mounting the heat spreader over the inner package with a connection side of the device mounting structure exposed within the opening.

11. An integrated circuit packaging system comprising:
    a device mounting structure over a bottom substrate;
    a heat spreader having an opening formed by a single integral structure with a dam and a flange, the dam having a dam height greater than a flange height of the flange; and
    a package encapsulation over the device mounting structure and the bottom substrate and under the heat spreader with the device mounting structure exposed within the opening, the package encapsulation in contact with the dam only on a dam outer side of the dam, the package encapsulation in contact with the flange only on a flange bottom side, a side of the package encapsulation coplanar with a perimeter edge of the heat spreader.

12. The system as claimed in claim 11 wherein the heat spreader includes the heat spreader having the opening bounded by the dam, the dam having a dam width less than a flange width of the flange.

13. The system as claimed in claim 11 wherein the heat spreader includes the heat spreader over a connection side of the device mounting structure with the connection side exposed within the opening of the heat spreader.

14. The system as claimed in claim 11 further comprising:
    the device mounting structure over the bottom substrate; and
    wherein:
    the heat spreader includes the heat spreader having the opening with an opening center offset from a device mounting structure center of the device mounting structure.

15. The system as claimed in claim 11 further comprising an inner integrated circuit over the bottom substrate.

16. The system as claimed in claim 11 wherein the heat spreader includes the heat spreader having the opening bounded by the single integral structure with the dam and the flange, the dam having the dam width greater than the flange height of the flange;
    further comprising:
    an inner integrated circuit mounted over the bottom substrate and under the device mounting structure.

17. The system as claimed in claim 16 wherein the inner integrated circuit is mounted on the bottom substrate.

18. The system as claimed in claim 16 further comprising a wire-in-film adhesive on the inner integrated circuit.

19. The system as claimed in claim 16 further comprising:
    a redistribution layer on the device mounting structure; and
    wherein:
    the heat spreader includes the heat spreader having the opening exposing the redistribution layer.

20. The system as claimed in claim 16 further comprising:
    an inner package having the device mounting structure over the bottom substrate; and
    wherein:
    the heat spreader includes the heat spreader over the inner package with a connection side of the device mounting structure exposed within the opening.

* * * * *